US008184464B2

(12) United States Patent
Chu et al.

(10) Patent No.: US 8,184,464 B2
(45) Date of Patent: May 22, 2012

(54) FLASH MEMORY

(75) Inventors: Kuei-Wu Chu, Taoyuan County (TW);
Jimmy Liang, Taoyuan County (TW);
Leo Lu, Taoyuan County (TW)

(73) Assignee: Aflash Technology, Co., Ltd., Luzhu Township, Taoyuan County (TW)

( * ) Notice: Subject to any disclaimer, the term of this patent is extended or adjusted under 35 U.S.C. 154(b) by 185 days.

(21) Appl. No.: 12/780,109

(22) Filed: May 14, 2010

(65) Prior Publication Data
US 2011/0019457 A1 Jan. 27, 2011

(51) Int. Cl.
*G11C 5/06* (2006.01)
(52) U.S. Cl. ..................... 365/63; 365/185.05
(58) Field of Classification Search .............. 365/63, 365/185.05
See application file for complete search history.

(56) References Cited

U.S. PATENT DOCUMENTS

| | | | | |
|---|---|---|---|---|
| 5,742,086 A | * | 4/1998 | Rostoker et al. | 257/300 |
| 6,175,517 B1 | * | 1/2001 | Jigour et al. | 365/63 |
| 7,746,719 B2 | * | 6/2010 | Kang | 365/225.7 |
| 7,875,985 B2 | * | 1/2011 | Hiller et al. | 257/786 |
| 2001/0038547 A1 | * | 11/2001 | Jigour et al. | 365/43 |
| 2008/0150111 A1 | * | 6/2008 | Hiller et al. | 257/686 |
| 2009/0027939 A1 | * | 1/2009 | Kang | 365/51 |
| 2010/0002512 A1 | * | 1/2010 | Cornwell et al. | 365/185.09 |

* cited by examiner

*Primary Examiner* — Tuan T. Nguyen
(74) *Attorney, Agent, or Firm* — Muncy, Geissler, Olds & Lowe, PLLC

(57) ABSTRACT

A flash memory includes a controller unit and dies. The dies are connected to a controller unit. Each of the dies includes an upper face and a lower face. Each of the dies includes at least one power supply pad, at least one grounding pad, at least one input/output pad, selection pads and standby/busy pads on each of the upper and lower faces. The power supply pad is connected to the controller unit. The grounding pad is connected to the power supply pad in parallel. The input/output pad is connected to the grounding pad in parallel. The selection pads are connected to the controller unit and connected to one another with a wire that can be cut if so desired. The standby/busy pads are connected to the controller unit and connected to one another with a wire that can be cut if so desired.

8 Claims, 6 Drawing Sheets

FLASH MEMORY

FIELD OF THE INVENTION

The present invention relates to a flash memory and, more particularly, to a flash memory including dies that are interconnected in an easily manageable, inexpensive and highly customized manner.

DESCRIPTION OF THE RELATED ARTS

A die of a flash memory includes at least one power supply pad, at least one grounding pad, at least one input/output pad, selection pads and standby/busy pads. When dies are stacked and packaged, the pads of a die are connected to the pads of another die by bonding. Bonding provides flexibility for connecting the pads. However, a die in a stack requires a different layout than another die in the same stack. Therefore, different wafers must be made, i.e., different masks must be designed. Accordingly, the manufacturing is difficult, the cost is high, and customization is difficult.

The present invention is therefore intended to obviate or at least alleviate the problems encountered in prior art.

SUMMARY OF THE INVENTION

It is the primary objective of the present invention to provide a flash memory including dies that are interconnected in an easily manageable, inexpensive and highly customized manner.

To achieve the foregoing objective, the dies are connected to a controller unit. Each of the dies includes an upper face and a lower face. Each of the dies includes at least one power supply pad, at least one grounding pad, at least one input/output pad, selection pads and standby/busy pads on each of the upper and lower faces. The power supply pad is connected to the controller unit. The grounding pad is connected to the power supply pad in parallel. The input/output pad is connected to the grounding pad in parallel. The selection pads are connected to the controller unit and connected to one another with a wire that can be cut if so desired. The standby/busy pads are connected to the controller unit and connected to one another with a wire that can be cut if so desired.

Other objectives, advantages and features of the present invention will be apparent from the following description referring to the drawings.

BRIEF DESCRIPTIONS OF THE DRAWINGS

The present invention will be described via detailed illustration of two embodiments referring to the drawings.

DESCRIPTION OF THE PREFERRED EMBODIMENT

Figure 1:
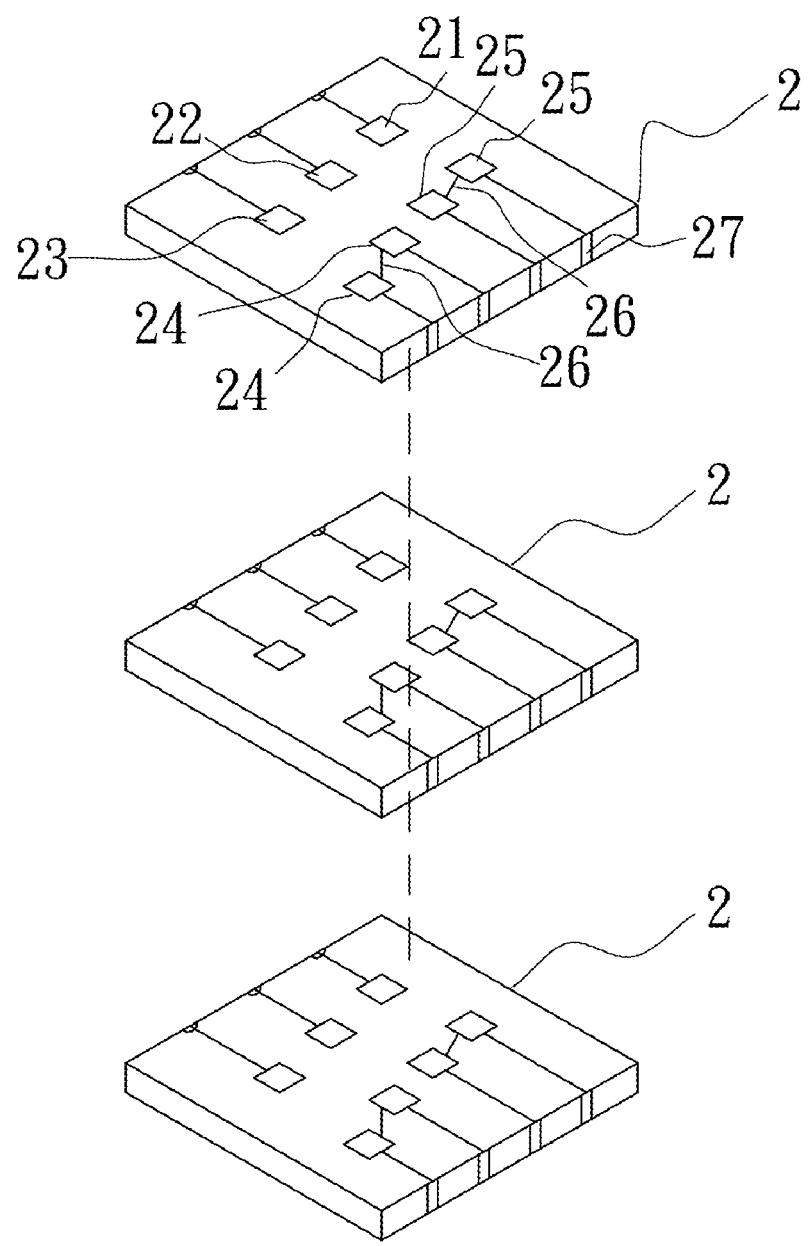
FIG. 1 is a perspective view of dies according to the first embodiment of the present invention.
Figure 2:
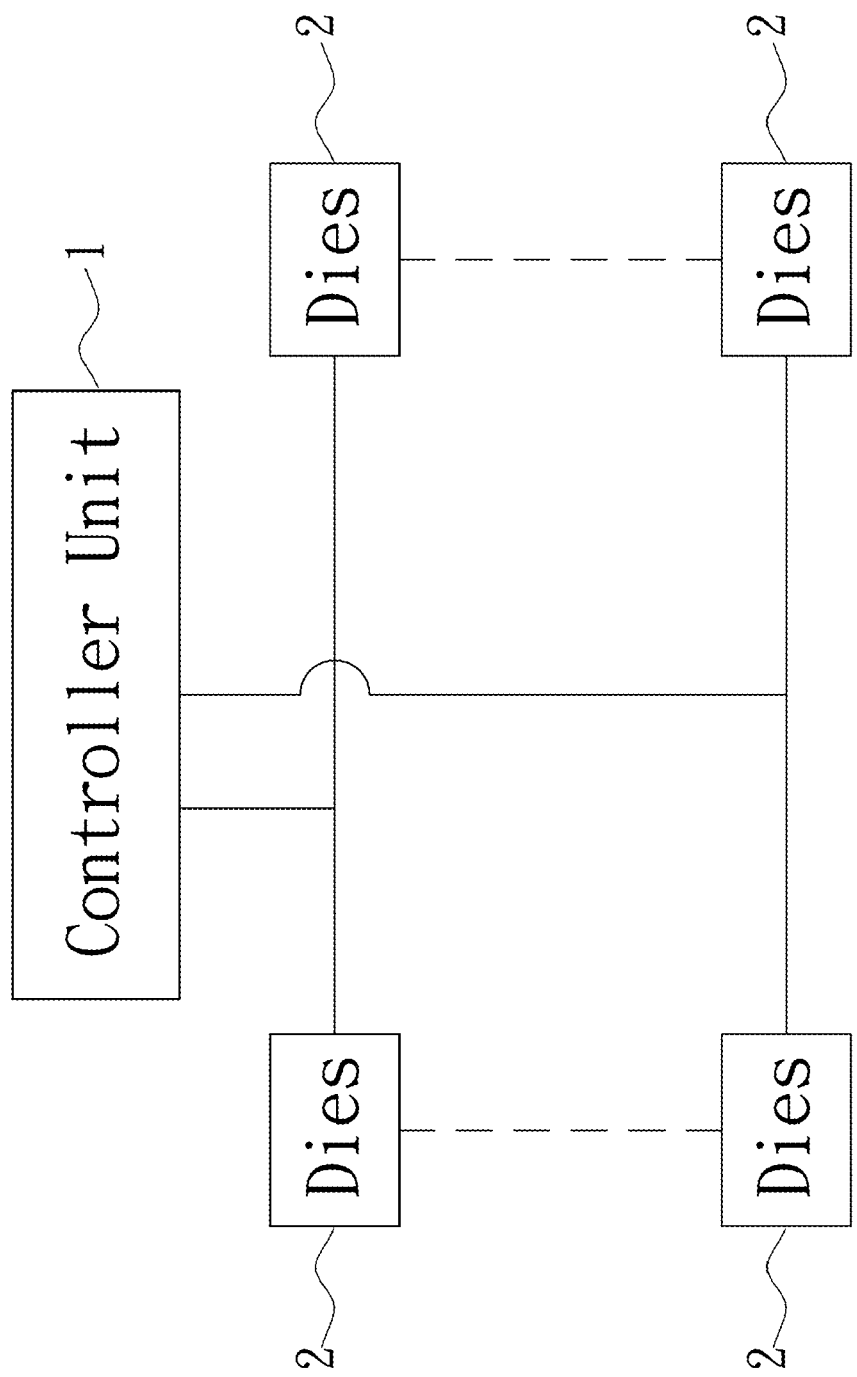
FIG. 2 is a block diagram of a flash memory including the dies shown in FIG. 1.
Figure 3:
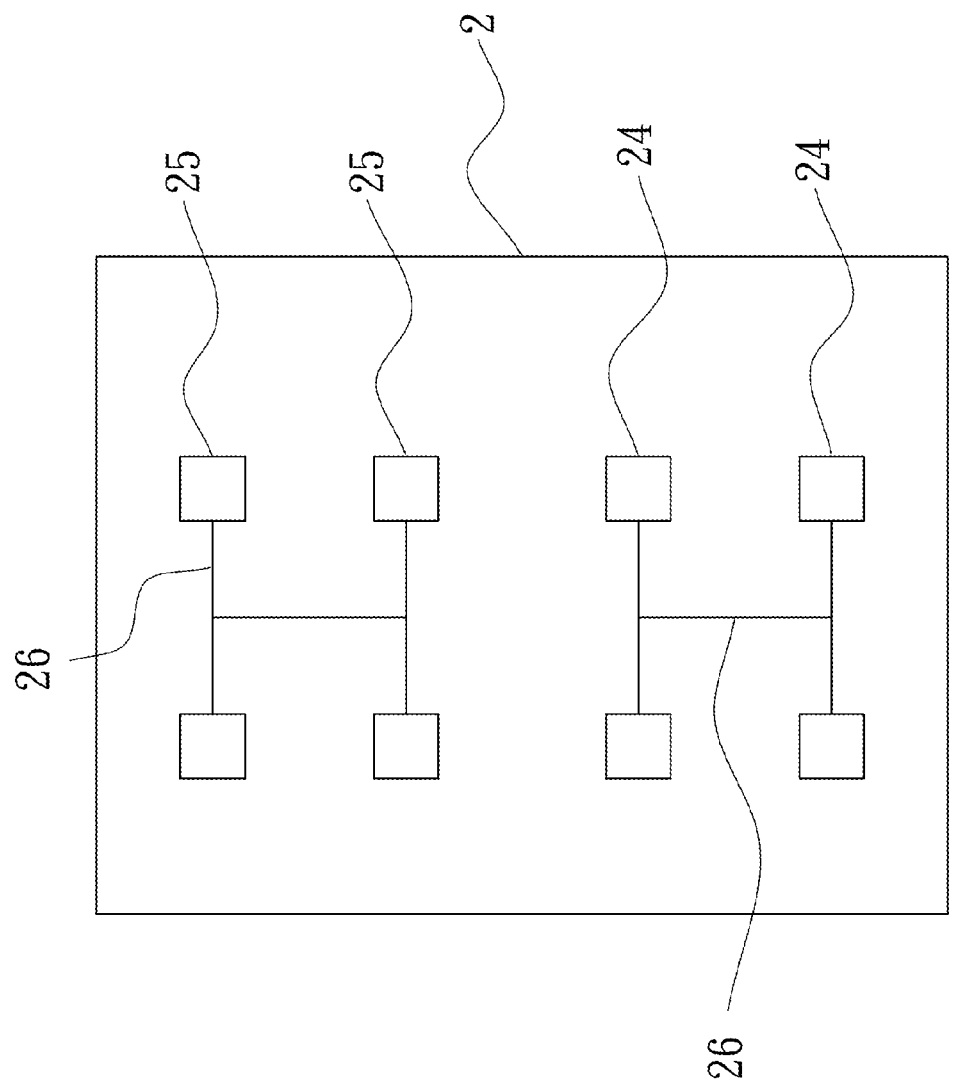
FIG. 3 is a top view of one of the dies shown in FIG. 1.
Figure 4:
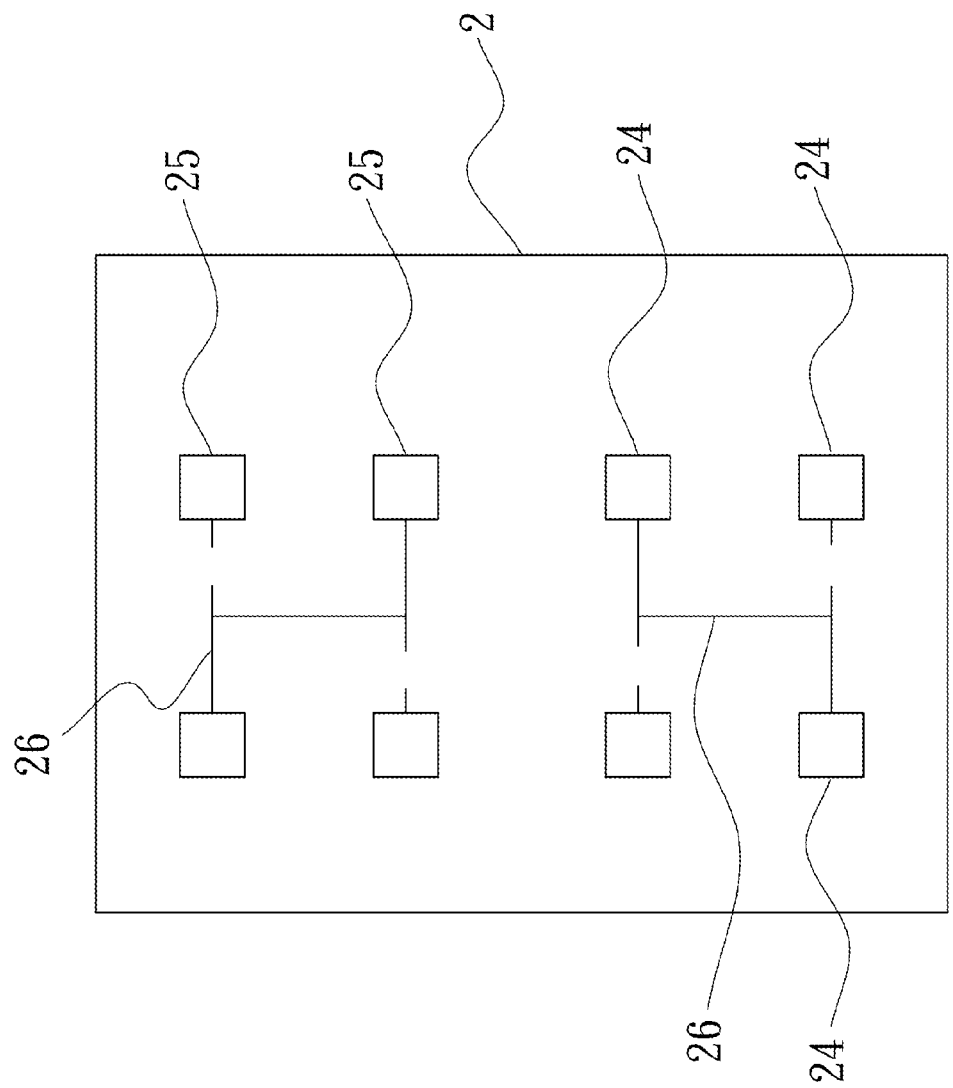
FIG. 4 is a top view of the die shown in FIG. 3 after processing.

Referring to FIGS. 1 through 4, a flash memory includes a controller unit 1 and dies according to a first embodiment of the present invention. The controller unit 1 is preferably a controller chip.

The dies 2 are identical to one another. Each of the dies 2 includes a power supply pad 21, a grounding pad 22, an input/output pad 23, selection pads 24 and standby/busy pads 25 formed on each of upper and lower faces. The power supply pad 21, the grounding pad 22 and the input/output pad 23 are connected to one another in parallel and connected to the controller unit 1. The selection pads 24 are connected to one another with a wire 26. The standby/busy pads 25 are connected to one another by a wire 26. The selection pads 24 are connected to the controller unit 1. The standby/busy pads 25 are connected to the controller unit 1, too. Each of the pads 21, 22, 23, 24 and 25 is connected to a contact provided on a side of the die 2. Thus, the power supply pad 21 on the upper face is connected to the power supply pad 21 on the lower face. The grounding pad 22 on the upper face is connected to the ground pad 22 on the lower face. The input/output pad 23 on the upper face is connected to the input/output pad 23 on the lower face. The selection pads 24 on the upper face are connected to the selection pads 24 on the lower face. The standby/busy pads 25 on the upper face are connected to the standby/busy pads 25 on the lower face.

In making the flash memory according to a desired layout, the dies 2 are stacked, and the contacts 27 are connected to one another in a desired manner. That is, the power supply pad 21, the grounding pad 22, the input/output pad 23, the selection pads 24 and the standby/busy pads 25 of a die 2 are connected to that of another die 2 in a desired manner. As clearly shown in FIGS. 3 and 4, any of the wires 26 can be interrupted or cut with laser if so desired. Therefore, the dies 2 are interconnected in an easily manageable, inexpensive and highly customized manner.

Figure 5:
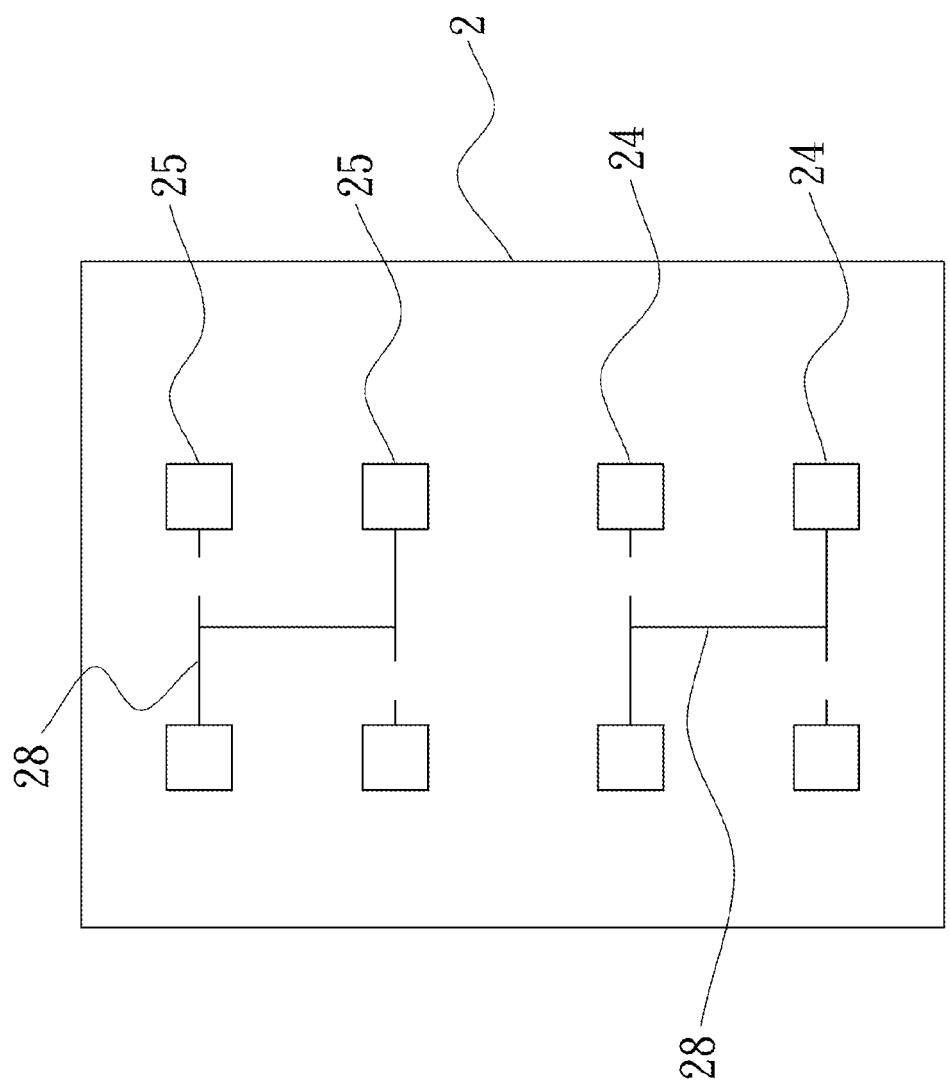
FIG. 5 is a top view of a die according to the second embodiment of the present invention.
Figure 6:
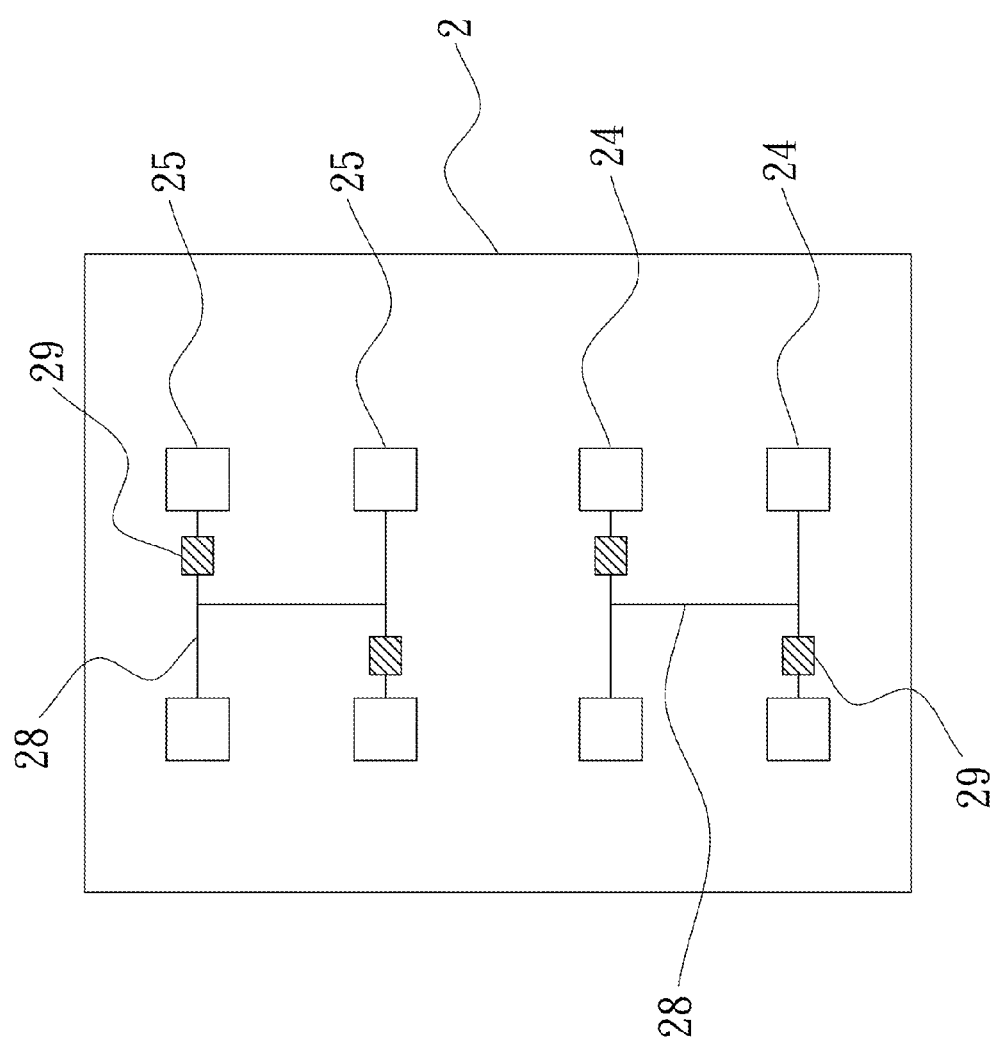
FIG. 6 is a top view of the die shown in FIG. 5 after processing.

Referring to FIGS. 5 and 6, there is shown a die 2 according to a second embodiment of the present invention. The second embodiment is like the first embodiment except including broken wires 28 between the selection pads 24 and between the standby/busy pads 25. Any of the broken wires 28 can be amended with a patch if so desired. The patches 29 can be provided by soldering or printing.

The present invention has been described via the detailed illustration of the embodiments. Those skilled in the art can derive variations from the embodiments without departing from the scope of the present invention. Therefore, the embodiments shall not limit the scope of the present invention defined in the claims.

What is claimed is:

1. A flash memory comprising:
    a controller unit; and
    dies each comprising an upper face and a lower face, wherein each of the upper and lower faces is formed with:
        at least one power supply pad connected to the controller unit;
        at least one grounding pad connected to the power supply pad in parallel;
        at least one input/output pad connected to the grounding pad in parallel;
        selection pads connected to the controller unit and connected to one another with a wire that can be cut if so desired; and
        standby/busy pads connected to the controller unit and connected to one another with a wire that can be cut if so desired.

2. The flash memory according to claim 1, wherein the controller unit is a controller chip.

3. The flash memory according to claim 1, wherein each of the dies comprises contacts formed on a side thereof, wherein each of the contacts is connected to a related one of the pads formed on upper face and a related one of the pads formed on the lower face.

4. A flash memory comprising:
a controller unit; and
dies each comprising an upper face and a lower face, wherein each of the upper and lower faces is formed with:
at least one power supply pad connected to the controller unit;
at least one grounding pad connected to the power supply pad in parallel;
at least one input/output pad connected to the grounding pad in parallel;
selection pads connected to the controller unit;
broken wires formed between the selection pads, wherein each of the broken wires can be mended with a patch if so desired; and
standby/busy pads connected to the controller unit; and
broken wires formed between the selection pads, wherein each of the broken wires between the standby/busy pads can be mended with a patch if so desired.

5. The flash memory according to claim 4, wherein the controller unit is a controller chip.

6. The flash memory according to claim 4, wherein each of the dies comprises contacts formed on a side thereof, wherein each of the contacts is connected to a related one of the pads formed on upper face and a related one of the pads formed on the lower face.

7. The flash memory according to claim 4, wherein the patches are provided by soldering.

8. The flash memory according to claim 4, wherein the patches are provided by printing.

* * * * *